United States Patent [19]

Ma et al.

[11] Patent Number: 5,466,653
[45] Date of Patent: Nov. 14, 1995

[54] METHOD FOR PREPARING NEGATIVE-WORKING WASH-OFF RELIEF IMAGES AND NON-PHOTOSENSITIVE ELEMENTS FOR USE THEREIN

[75] Inventors: Sheau-Hwa Ma, Chadds Ford, Pa.; Michael W. J. West, Wilmington, Del.

[73] Assignee: E. I. Du Pont de Nemours and Company, Wilmington, Del.

[21] Appl. No.: 268,757

[22] Filed: Jun. 29, 1994

[51] Int. Cl.$^6$ ............................... B41M 5/20; B41M 5/24
[52] U.S. Cl. .......................... 503/200; 427/145; 427/264; 427/273; 427/353
[58] Field of Search ..................................... 427/145, 264, 427/273, 353; 428/195, 199; 503/200

[56] References Cited

U.S. PATENT DOCUMENTS 5,209,814  5/1993  Felten et al. ........................ 156/635 X
5,270,078  12/1993  Walker et al. .......................... 427/264

FOREIGN PATENT DOCUMENTS 1431462  11/1973  United Kingdom .

*Primary Examiner*—Michael Lusignan

[57] ABSTRACT

A method for preparing high resolution, negative-working, wash-off relief images, preferably using ink jet printing, comprising the sequential steps of: (a) providing a non-photosensitive layer comprising an acid-containing polymer; (b) applying an ink imagewise to the non-photosensitive layer to produce image areas and unimaged areas, said ink comprising an esterification agent which is capable of reacting with the acid groups in the polymer to form water-insoluble ester groups; (c) drying the non-photosensitive layer to induce or accelerate the esterification reaction between the acid groups and the esterification agent in the imaged areas; and (d) washing the non-photosensitive layer with an aqueous developer solution to remove the unimaged areas of the non-photosensitive layer is described.

22 Claims, No Drawings

METHOD FOR PREPARING NEGATIVE-WORKING WASH-OFF RELIEF IMAGES AND NON-PHOTOSENSITIVE ELEMENTS FOR USE THEREIN

FIELD OF INVENTION

This invention relates to a method for preparing high resolution, negative-working, wash-off relief images from non-photosensitive elements and to elements for use therein.

BACKGROUND OF THE INVENTION

It is known in the art that images may be prepared using what is known as a "wash-off" development step in which a latent image is developed by washing with water or other aqueous or non-aqueous developing solutions. Such techniques have been widely used in the preparation of flexographic plates, printed circuits, etc. from photosentitive compositions.

It is also known in the art that relief images may be prepared from photosensitive or non-photosensitive elements using wash-off development techniques in which the image layer is applied with an ink jet printer. For example, British Patent 1,431,462 discloses such a method. More specifically, this reference discloses positive and negative-working systems for forming a relief image using primarily natural proteinaceous materials. In the negative-working system, a polymer coating (e.g. gelatin) is crosslinked, polymerized, or otherwise imagewise hardened by applying a suitable agent (e.g. formaldehyde) using ink jet printing and then dissolving the unhardened areas with a developing solution. In the positive-working system, ink jet printing is used to apply an agent (e.g. enzyme) which will degrade an otherwise insoluble polymer coating, thus rendering it soluble in the developing solution.

Although desirable in principle, the methods disclosed in the aforementioned British Patent are disadvantageous in practice for several reasons. First, the natural proteinaceous polymers disclosed, lack many physical characteristics necessary for most relief applications, thus rendering such reliefs of limited practical or commercial utility. Second, crosslinking and degradation reactions are relatively slow, particularly at room temperature, thus decreasing the efficiency of the process. Although it is disclosed that heat can be applied to facilitate the reaction, this requires an additional step and presents other complications. Third, many of the crosslinking agents, such as aldehydes, are environmentally disadvantageous. Fourth, the use of photopolymerizable compositions requires an additional exposure step, which increases cost and lowers efficiency. Fifth, many of the developing solutions are either organic solvent based, highly alkaline, or maintained at elevated temperatures. All of these properties present additional environmental and safety hazards. Sixth, the latent images generated by such methods are not stable, reducing the utility of the process. Finally, the resolution obtained from these methods is marginal and often inadequate for commercial applications.

The present invention overcomes many of these disadvantages and provides a process which poses minimal environmental risks, is easy to use and produces images of high resolution in a very short period of time.

SUMMARY OF THE INVENTION

The invention is directed to a method for preparing high resolution, negative-working, wash-off relief images comprising the sequential steps of:

(a) providing a non-photosensitive layer, preferably on a support or substrate, said non-photosensitive layer comprising an acid-containing polymer;

(b) applying an ink imagewise to the non-photosensitive layer to produce imaged areas and unimaged areas, said ink comprising an esterification agent which is capable of reacting with the acid groups in the polymer to form water-insoluble ester groups;

(c) drying the non-photosensitive layer to induce or accelerate the esterification reaction between the acid groups and the esterification agent in the imaged areas; and (d) washing the non-photosensitive layer with an aqueous developer solution to remove the unimaged areas of the non-photosensitive layer.

The drying in step (c) may be conducted in the presence of heat to accelerate the esterification reaction.

In another embodiment, the present invention is directed to the formation of an image according to the above process.

In a further embodiment, the present invention comprises an aqueous developable element containing a latent image, said element comprising:

(a) a non-photosensitive layer on a substrate, said non-photosensitive layer comprising an acid-containing polymer that is removable by aqueous developers; and (b) said non-photosensitive layer containing a latent image in the form of a stable, water-insoluble polymer blend, said latent image having been formed by imagewise applying an ink layer to said non-photosensitive layer, and drying, optionally in the presence of heat. The ink comprises an esterification agent capable of converting the acid groups to ester groups.

In the preferred embodiments, the step of applying the aqueous ink is accomplished by use of an ink jet printer.

DETAILED DESCRIPTION OF THE INVENTION

The present invention offers several advantages over the prior art previously discussed. For example, the present invention is more environmentally advantageous than the prior art because it utilizes aqueous solutions for development. In addition, the present process (a) does not use potentially toxic monomers, and is safer and easier to use (b) does not require additional exposure and (c) does not need a yellow light area during processing. Images formed by the present process have surprisingly good resolution and sharp edges.

The element can be washed to develop the image immediately after the image layer has been applied and heated, which greatly simplifies the process and improves efficiency. Also, the reaction between the esterification agent and the active layer forms a stable water-insoluble polymer blend, which permits storage of the element, with the latent image intact, for an indefinite period of time prior to being developed with an aqueous solution.

ACTIVE LAYER

Acid-Containing Polymer

Particularly suitable acid containing polymers for use in the present invention are those that possess an acid number of about 0.4 milliequivalents/gram of polymer. The acid number of a polymer defines the number of acid functions in milliequivalents (meq) per unit weight of the polymer. It has a direct correlation to the solubility of the polymer in aqueous solutions. Thus, the higher the acid number, the greater the solubility in aqueous solutions. In practicing the present invention, the acid number of a polymer needs to be high enough so that the polymer becomes soluble in an alkaline developer solution. Also, if the acid number is high enough, the polymer will be soluble in water in its acid form, thus allowing the development of the latent image to be carried out in plain water. Generally, polymers possessing acid numbers of above about 12.5 meq tend to be water soluble. However, in the imaged areas, the polymer needs to have a high percentage of its acid groups converted to the ester functions to become insoluble in the developer solution. In addition, a potential problem associated with a polymer having a high acid number is moisture sensitivity, because it causes difficulties in handling the element.

It is also desirable to keep the acid number of the polymer low so that a minimum level of esterification reaction is required to produce a sufficient solubility change to differentiate the imaged and unimaged areas. Such systems could potentially offer higher imaging speed, lower concentration of the esterification agent in the ink, and milder processing conditions. Depending on the chemical nature and molecular weight of the selected polymer, the optimal acid number for this invention will vary. However, a useful range suitable for practicing this invention is from about 0.4 to 11.0 meq per unit weight of the polymer, preferably from about 0.4 to about 5.0 meq per unit weight of the polymer. Notwithstanding these ranges, it should be readily apparent to those skilled in this art area that altering the placement of the acid groups could permit practice of this invention at less than 0.4 meq per unit weight of the polymer.

Acid containing polymers which are particularly useful in the present invention are vinyl addition polymers containing free carboxylic acid groups. Examples of such polymers include acrylic polymers, styrene acrylic copolymers, methacrylic polymers, a-methylstyrene acrylic copolymers, and styrene maleic anhydride copolymers. These polymers can be easily made by polymerization techniques familiar to those skilled in the art. A convenient method to incorporate the acid functions in a polymer is to polymerize monomers already containing acid or acid precursor functions, such as, acrylic acid, methacrylic acid, trimethylsilyl methacrylate, trimethylsilyl acrylate, tert-butyl methacrylate, tert-butyl acrylate, crotonic acid, itaconic acid, itaconic acid monoester, maleic acid, maleic acid monoester, maleic anhydride, fumaric acid, fumaric acid monoester, and the like.

As is known to those skilled in the art, the acid-containing monomers can be copolymerized with non-acid-containing monomers to adjust the physical properties, including solubility properties of the polymer. Monomers that are particularly useful for this purpose include methyl acrylate, ethyl acrylate, propyl acrylate, n-butyl acrylate, hexyl acrylate, 2-ethylhexyl acrylate, phenyl acrylate, 2-phenylethyl acrylate, hydroxylethyl acrylate, methyl methacrylate, ethyl methacrylate, propyl methacrylate, n-butyl methacrylate, hexyl methacrylate, 2-ethylhexyl methacrylate, phenyl methacrylate, 2-phenylethyl methacrylate, hydroxyethyl methacrylate, styrene, a-methyl styrene, vinyl naphthalene, vinylidene chloride, vinyl acetate, vinyl chloride, and the like.

Representative commercially available acid-containing polymers which can be used in the present invention include the SMA® polymers (Sartomer Co., West Chester, Pa.), the Carboset® polymers (B. F. Goodrich Co., Cleveland, Ohio), Morcryl® polymers (Morton Thiokol Co., Chicago, Ill.), Nacrylic® polymers (National Starch and Chemical, Bridgewater, N.J.), and Joncryl® polymers (Johnson Wax, Racine, Wis.).

Colorant

If a precolored element is desired for color imaging applications such as color proofing, the active layer may contain one or more colorants. Important criteria for the selection of the colorant are chemical stability, color, brightness of shade, and light fastness. The colorant should not undergo chemical reaction with any of the other components of the active layer before, after, or during imaging.

Useful colorants include dyes and pigments. Dyes are known to have superior color properties such as color strength and transparency, but usually are not as lightfast as pigments. The water soluble dyes such as acid dyes, direct dyes, reactive dyes, and food dyes should be avoided as they will be washed off during the aqueous development step.

Useful pigments comprise a wide range of organic and inorganic pigments. Dyes and pigments suitable for practicing the instant invention can be found in the "Buyer's Guide For Textile Chemists And Colorists", published by American Associate of Textile Chemists And Colorists, Research Triangle Park, N.C., the disclosure of which is herein incorporated by reference.

It is preferred for the pigment particles to be dispersed and stabilized with a dispersant, preferably a polymeric dispersant. A wide range of dispersants is commercially available. Non-polymeric and polymeric dispersants are acceptable for practicing the invention and are listed on pages 110–129, 1990 McCutcheon's Functional Materials, North American Edition, Manufacturing Confection Publishing Co., Glen Rock, N.J., the disclosure of which is herein incorporated by reference.

A dispersant will be selected according to the characteristics of the pigment surface and other components in the composition as practiced by those skilled in the art. The dispersant should not contain functional groups that interact with the acid-containing polymers, because this may impede the interaction between the esterification agent and the polymer or adversely affect the coating quality by flocculating the pigment dispersion. Standard pigment dispersing techniques, such as ball milling, sand milling, may be employed. In accordance with principles well known to those skilled in the art, the concentration of colorant will be chosen to achieve the optical density desired in the final image.

Plasticizers

In a preferred embodiment, a plasticizer is used to facilitate the penetration of the esterification agent into the film and to adjust the film forming properties in the non-photosensitive active layer. The plasticizer should have reasonable compatibility with the polymer and other components of the film composition.

Useful plasticizers are well known to those skilled in the art and are commercially available. In general, water insoluble plasticizers are preferred for greater storage stability during conditions of high humidity and environmental operating latitude, but are not required. The plasticizer may be present in an amount effective for the intended purpose, and the optimal level can be determined experimentally. The principles and lists of useful plasticizers for various types of polymers can be found in "The Technology of Plasticizers" published by John Wiley & Sons Inc. and are herein incorporated by reference. However, examples of such plasticizers include dibutyl phthalate and tributyl phosphate.

Polymeric Modifiers

The non-photosensitive layer composition may contain a second polymeric material to modify adhesion, flexibility, hardness, moisture sensitivity and other mechanical or chemical properties required during its processing or end use. Suitable polymeric binders which can be used in combination with the acid-containing polymer include acrylate and methacrylate polymers, e.g., poly(methyl methacrylate), poly(ethyl methacrylate), etc.; vinyl polymers and copolymers, e.g., poly(styrene(70)/methyl methacrylate(30)), acrylonitrile/butadiene/styrene, polystyrene, etc.; polyvinyl acetals, e.g. poly(vinyl acetal), poly(vinyl formal), etc.; polyesters, e.g., poly(tetramethylene terephthalate), etc.; condensation polymers, e.g., polycarbonate, polysulfone, polyetherimide, polyphenylene oxide, poly(1,4-cyclohexanedimethanol terephthalate), etc.; butadiene copolymers, e.g., styrene butadiene copolymers, etc.; cellulose esters and ethers, e.g., ethyl cellulose, etc.; and polyurethanes.

For formulations having improved environmental latitude, the selection of a polymeric modifier may depend on its glass transition temperature ("Tg"). The Tg of a polymer is affected by the chemical structures of the main chain and the side groups. Polymers with rigid structures generally show high Tg's while more flexible polymers exhibit lower Tg's. Polymers of desired Tg may be obtained by copolymerization of proper combinations of rigid and flexible monomers. The Tg's of many well known polymers are summarized in Section III of "POLYMER HANDBOOK", ed. J. Brandrup & E. H. Immergut, John Wiley & Sons, Inc., 1975, pages 140– 192.

The polymeric modifier may be present in an effective amount for the intended purpose, but the amount should not be too high so as to impede the solubility characteristics of the active layer. The polymeric modifier, provided it does not adversely affect the properties required for the process and the end use, may be particularly advantageous to have limited compatibility with the acid-containing polymer present in the non-photosensitive active layer to create a two-phase structure. The interfaces between the two phases will facilitate diffusion of the esterification agent into the polymer layer. Plasticizers may also be used for this function.

Adhesion Promoting Agents

The non-photosensitive polymer layer can be used as a coating on a metal surface as seen in the preparation of, for example, a resist or lithographic printing plate. Therefore, a heterocyclic or mercaptan compound may be added to improve adhesion of the polymer layer to the metal. Suitable adhesion promoters are disclosed in U.S. Pat. No. 3,622,334, U.S. Pat. No. 3,645,772, and U.S. Pat. No. 4,710,262.

Process of Preparation

Depending upon the composition of the non-photosensitive active layer, either an aqueous or solvent medium may be used to prepare the composition for coating on the selected substrate. The acid-containing polymers can be dissolved in an aqueous solution by reacting them with a volatile salt-forming agent, e.g., ammonium hydroxide, which will evaporate upon drying, leaving the neutral polymer on the substrate. Similarly, suitable solvents may be selected which will dissolve the components of the non-photosensitive active layer and evaporate after coating.

The non-photosensitive active layer may be coated onto the substrate using a variety of conventional, well known coating techniques such as extrusion die, doctor knife, wire wound bar, spin coating; printing techniques such as screen printing, gravure printing, lithographic printing; or simply wiping with a brush, sponge or other applicator. The coating may be dried by air, heat, vacuum, or combinations of these methods.

SUPPORT

The support may be any suitable film which has the necessary stiffness and dimensional stability and which exhibits proper adhesion to the active layer and the ability to withstand the aqueous processing conditions. Examples of useful supports include glass, cellulose triacetate, polyethylene terephthalate, etc. A removable support is required for the preparation of a multicolor image. Gelatin subbed and resin subbed polyethylene terephthalate films are preferred for this application.

In applications such as lithographic printing plates, solder masks and printed circuits, the support may contain metal. Typical supports for resist applications include combinations such as phenolic or epoxy resins on paper or paper-glass composites as well as polyester, epoxy, polyimide, polytetrafluoroethylene or polystyrene on glass. In most instances, these supports are also clad with a thin layer of electroconductive metal of which copper is by far the most common. Suitable supports for lithographic printing plates include those disclosed in U.S. Pat. No. 4,072,528 and U.S. Pat. No. 3,458,311.

INKS

In the process of this invention, the esterification agent is preferably applied to the active layer using ink jet printing techniques. Ink jet printing is a non-impact printing process in which an electronic signal produces droplets of ink that are deposited on a substrate. Ink jet printers are broadly utilized as output for personal and other computers due to their reliability, print quality, low cost, relatively quiet operation and graphics capability.

Although ink jet printing is the preferred method of applying the ink, it is to be understood that the invention is not limited to ink jet printing. Rather, the ink layer may also be applied with conventional writing implements (e.g. felt tip pens, fountain pens, paint brushes) or by other techniques known in the art. It will be apparent that the particular technique of applying the ink will depend upon the desired application and the demands thereof.

Aqueous Inks

The aqueous inks suitable for use in the present invention comprise an aqueous carrier medium and an esterification agent. Other components may be present in the inks as discussed hereinbelow.

Aqueous Carrier Medium

The aqueous carrier medium comprises water, preferably deionized water, or a mixture of water and at least one water soluble organic solvent. Most preferred are organic solvents having at least one hydroxyl group (diethylene glycol, triethylene glycol, butyl carbitol, etc.). Selection of a suitable mixture of water and water soluble organic solvent depends upon the requirements of the specific application, such as desired surface tension and viscosity, drying time of the ink, and the composition of the non-photosensitive polymer layer.

The aqueous carrier medium will usually contain from about 5% to about 95% water, with the remainder, i.e., 95% to about 5%, being the water soluble organic solvent. For ink jet printing applications, the preferred ratios are approximately 60% to about 95% water, based on the total weight of the aqueous carrier medium. Higher concentrations of organic solvent may result in poor print quality. Lower concentrations will lead to drying out of the printhead or "crusting" of the ink.

The aqueous carrier medium is present in the range of approximately 10 to 99%, preferably approximately 65 to 99% and most preferably approximately 85 to 98.5%, based on total weight of the ink. The amount of aqueous carrier medium in a particular ink will largely be dependent upon the amount of esterification agent needed to form the insoluble polymer blend. The presence of other ink ingredients as described herein will also influence the concentration of the aqueous carrier medium.

Esterification Agent

The esterification agent is a compound which is relatively stable in water, but is capable of efficiently converting an acid group to an ester group in the substantial absence of water or other hydrogen-bonding compounds. The esterification agent may be represented by the general formula:

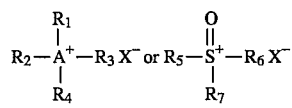

wherein A is N, P, or S;

$R_1$, $R_2$, $R_3$, $R_4$, $R_5$, $R_6$, or $R_7$ are each independently alkyl, substituted alkyl, aryl, or substituted aryl having 1 to 9 carbon atoms, with the proviso that $R_4$ is not present when A is S; and X is an anion selected from the group consisting of hydroxide, carbonate, bicarbonate, halides, organic sufate such as methyl sulfate, and organic sulfonate such p-toluenesulfonate.

The $R_1$ to $R_4$ or $R_5$ to $R_7$ groups should not contain any functional groups that interfere with the esterification reaction. Suitable substituents include, but are not limited to, ether, halogen, ester, and amino groups. Some examples of useful esterification agents include tetramethylammonium hydroxide, phenyltrimethylammonium hydroxide, trimethylsulfonium hydroxide, trimethylsulfoxonium hydroxide, and (methoxymethyl)trimehtylammonium hydroxide.

The esterification agent used in the process of this invention may also include molecules that contain more than one esterification sites as those described above per molecule. If more than one esterification site is present per molecule, it may act as a crosslinking agent by simultaneously reacting with acid groups from different polymer chains. For example, an esterification agent of the general formula of $A_3N^+XN^+A_3\ Y^-_2$, wherein A is an alkyl group, X is a diradical which connects the two positively charged nitrogen atoms, and Y is the counterion, may be used with a polymer which contains more than one acid group per polymer chain. If both positively charged nitrogen centers were to react with two acid groups on two separate polymer chains, and the esterification in both cases took place on X, a polymer network could be constructed for some desirable properties such as robustness of the image. Thus, in order to efficiently crosslink a polymer, the group connecting the positively charged esterification sites should be more reactive than other groups bound to these esterification sites.

The amount or concentration of the esterification agent in the ink should be sufficient to convert enough acid groups to the ester groups in the imaged areas thereby changing the solubility of the active layer in the developer solution. This will vary depending on the particular esterification agent selected, the composition of the non-photosensitive layer, the thickness of the non-photosensitive layer, etc. One of ordinary skill in the art is capable of determining the optimum amount of esterification agent for a given application by routine experimentation. Generally, the esterification agent will be present in a range of 1–90% by weight based upon the total weight of the ink composition.

Other Ingredients

In certain applications, it may be desirable for the ink to contain a colorant to give a visual indication of the image prior to the development step. Suitable ink colorants must be water-soluble or water-dispersable so as to be removed during the wash-off step, and may comprise dyes or pigments. If the pigment is not itself water-dispersable, a dispersant may be used. The colorant must also be compatible with the other ink ingredients so as to remain dissolved or dispersed therein.

Other ingredients, such as biocides, humectants, surfactants, viscosity modifiers, etc. may be present in the ink composition, if desired. Such compounds have long been used in ink formulations, particularly ink jet inks. Care must be exercised, however, to ensure that the final ink composition does not interfere with the formation of water-insoluble ester groups in the imaged areas of the polymer layer.

Solvent Inks

Ink jet printing devices equipped with print heads designed to handle organic solvent systems such as alcohols are commercially available from e.g. Videojet Systems, Division of A. B. Dick Co., Elk Grove Village, Ill. For use in such print heads, the esterification agent can be easily formulated in alcohols, such as methanol, ethanol, isopropanol, and polar aprotic solvents such as, for example, ketones such as acetone, cyclic and acyclic ethers such as tetrahydrofuran, and ethyleneglycol monomethyl ether, amides such as N,N-dimethylformaide, N,N-dimethylacetamide, and dimethyl sulfoxide, provided the selected esterification agent has the required solubility in the selected solvent. However, the esterification agents used in the process of the present invention are water-soluble compounds, and therefore the aqueous based inks are preferred. They are also preferred for environmental reasons.

Ink Properties

For ink jet printing, the physical properties of the ink should be compatible with the components in the print head and the ink ejecting conditions, i.e. driving voltage, frequency, and pulse width for thermal ink jet printing devices, driving frequency of the piezo element for either a drop-on-demand or a continuous device, and the shape and size of the nozzles. The ink needs to be thin with viscosity matching the print head design to ensure smooth delivery of ink droplets. Useful viscosities for the typical print heads are below 20 cP, preferably below 10 cP at 20° C. Surface tension is an important property because it prevents the ink from dripping out and wetting the nozzle plate and helps maintain the directionality of the ink droplet and the droplet integrity in the air to avoid splattering. Useful surface tensions range from 18–80 dyne/cm, preferably 25–70 dyne/cm at 20° C.

DRYING STEP FOR ESTERIFICATION

The esterification reaction if carried out in the presence of large amounts of water or solvents having strong hydrogen-bonding such as alcohols, particularly, the lower alcohols that are present in the ink layer, is slow or does not occur at a significant rate to affect the solubility of the active layer in the developer solution. As the amount of water or other hydrogen-bonding containing solvents decreases, the rate of the esterification reaction increases. It is believed that in most instances, the esterification reaction occurs in the "substantial absence" of water or other hydrogen-bonding compounds, but the complete absence of water or other hydrogen-bonding compounds is probably not necessary. However heat, although not required by all systems, can be effectively used to remove water and the hydrogen-bonding solvents by raising the film temperature to induce or accelerate the esterification reaction.

Hence, the esterification reaction may be carried out at a temperature of about 0° C. to about 200° C., preferably about 15° C. to about 150° C. and most preferably about 25° C. to about 130° C. The higher the temperature, the faster the esterification reaction will proceed. Of course, the polymers and other ingredients in the active layer should be stable at the process temperature, and if the polymer is sensitive to oxygen at higher temperatures, an inert atmosphere, such as nitrogen, may be used.

WASH-OFF DEVELOPMENT

After the element has been imaged with the ink and dried, optionally in the presence of heat, the unimaged areas are removed with an aqueous developer solution. When the polymer in the active layer is not soluble or swellable in water at a reasonable temperature, the developer is selected based upon its ability for reacting with the acid groups on the polymer to form an aqueous soluble salt.

For acid containing polymers, the preferred salt-forming compounds are organic or inorganic bases, such as alkali metal hydroxides (lithium, sodium, and potassium hydroxide); alkali metal carbonates and bicarbonates (sodium and potassium carbonates and bicarbonates); meta-silicates; organic amines (mono-, di-, tri-methylamine, morpholine); organic alcohol amines (dimethylethanolamine, methyl diethanolamine, mono-, di-, tri-ethanolamine); ammonium salts (ammonium hydroxide, tetraalkyl ammonium hydroxide) and pyridine.

The amount of salt-forming compound in the developer solution must be sufficient to form a salt with the unimaged polymer in the active layer, which will vary depending upon the particular salt-forming compound selected, the composition of the active layer, the thickness of the active layer, etc. One of ordinary skill in the art is capable of determining the optimum amount of the salt-forming compound for a given application by routine experimentation.

Optionally, low levels of water soluble surfactants may be present in the development solution to facilitate the interaction between the developer solution and the polymer in the active layer.

The element is immersed in a gently agitated developer solution for the unimaged areas to react with the developer and dissolve in the aqueous solution. The developer solution may be at a slightly raised temperature for more effective interaction with the element. Gentle rubbing may be needed to obtain complete removal of the unimaged areas for a clear background.

INDUSTRIAL APPLICABILITY

This invention is particularly useful in the field of graphic arts, such as printing plate, imagesetting, color proofing (including overlays and surprints), and in the field of electronics, such as solder masks, resists for printed circuit boards, dielectric layers, etc.

A one-color image can be produced by using a precolored active layer and following the imaging and development steps described above. To prepare a multicolor overlay proof, a series of one-color images is prepared, each on a transparent support. Each one-color image corresponds to a color separation. The series of one-color images is then stacked in register on a white background to produce a multicolor, overlay proof. A typical overlay proof consists of yellow, magenta, cyan, and black images, each produced from the corresponding color separations.

To prepare a multi-color surprint proof, elements that additionally comprise a thin layer, about 1 micron thick, of heat sensitive adhesive layer between the support and the active layer are used. The heat sensitive adhesive layer is nontacky under ambient condition, but becomes tacky at an elevated temperature. Useful examples for this invention are polymer compositions with a softening temperature at around 70° C.

A series of developed images, each corresponding to a different color separation of the multicolor image to be reproduced, is prepared as described above. The first developed image is laminated to a transfer sheet. The support is removed revealing the heat sensitive adhesive layer. Alternatively, if the heat sensitive layer is not present, a thin layer of adhesive may be coated on the image uncovered by the removal of the support. The second developed image is laminated in register to the previously formed image on the transfer sheet and the support removed. The process is repeated for each of the developed images. The multi-color image is transferred to the desired substrate by laminating the image to the substrate. The transfer sheet is preferably removed following lamination, but, if transparent, it may be left in place to protect the image. Although the image can be transferred to any of numerous substrates, such as, for example, paper, cloth, glass, china, metal sheet, polymer film, and the like, it will typically be transferred to the paper.

The transfer sheet consists of a dimensionally stable support on which is coated at least one layer of polymer. Transfer sheets suitable for practicing the invention are described in, for example, U.S. Pat. Nos. 4,766,053, and 5,094,931.

The invention is also suitable for use in producing a photomask for conventional imaging applications and may advantageously be integrated into such a system by laminating a precolored element of the present invention to a photopolymer composition, for example. The composite structure is then imaged as described herein to create the mask, and is then exposed in the normal manner. After removal of the photomask, the exposed element may then be processed in the usual way.

The present invention also has a variety of applications in novelty items, arts and crafts items, decorative items, etc., which may be imaged by the consumer with a personal message or drawing, or may be preimaged and merely developed by the consumer by washing.

EXAMPLES

The invention is further illustrated by, but not limited to, the following detailed examples of various embodiments. Parts and percentages are by weight unless otherwise noted.

Example 1

A 5.0% carbon black pigment dispersion was prepared according to the following procedure.

A mixture of 2.725 grams of Microlith® Black C-WA chip (Ciba Geigy Corp., Hawthorne, N.Y.), 6.5 grams of Carboset® XL-30 (35% solid, acid number 0.57 meq, B. F. Goodrich Co., Cleveland, Ohio), 0.9 grams of ammonium hydroxide solution (29.6% ammonia), 5.0 grams of isopropyl alcohol, and 14.85 grams of deionized water was roll-milled overnight with about 25 grams of 3/32" steel shot. The mixture was coated on 3 mil thick resin-subbed polyethylene terephthalate film base using a 0.08" wire wound bar. After drying, the coating was imaged using a Hewlett Packard (Hewlett Packard Co., Palo Alto, Calif.) DeskJet ink jet printer with an aqueous ink having the following composition: 0.1M of trimethylsulfoxonium hydroxide in water. The element was heated at about 135° C. for 5 minutes in a conventional oven. The unimaged areas were washed off with gentle rubbing in an alkaline developer solution Electrosol® 85 (1:1 dilution with water) manufactured by Du Pont-Howson Printing Systems (Leeds, England), to give a negative image. Afterwords, the element was rinsed with water. A high density high resolution black image with dots having sharp edges on a clear background was obtained.

Example 2

The black coating prepared from Example 1 was imaged and developed as in Example 1 with the exception that 0.1M of trimethylsulfoxonium hydroxide in a mixture of isopropyl alcohol and water (20:80) was used as the aqueous ink. A high density, high resolution black image on a clear background with dots having sharp edges was produced. The lines and the dots, however, were wider and larger than those in Example 1.

Example 3

A 5.0% yellow pigment dispersion was prepared according to the following procedure.

A mixture of 2.5 grams of Microlith® Yellow 3G-WA chip (Ciba Geigy Corp., Hawthorne, N.Y.), 7.0 grams of Carboset® XL-30 (35% solid, acid number 0.57 meq, B. F. Goodrich Co., Cleveland, Ohio), 0.9 grams of ammonium hydroxide solution (29.6% ammonia), 5.0 grams of isopropyl alcohol, and 14.6 grams of deionized water was roll-milled overnight with about 25 grams of 3/32" steel shot. The mixture was coated on a 3 mil thick resin-subbed polyethylene terephthalate film base using a 0.08" wire wound bar. After drying, the coating was imaged and developed as in Example 1 to give a high density, high resolution negative bright yellow image with dots having sharp edges on a slightly yellow background. The yellow background was due to interaction between the yellow pigment and the base upon heating.

Example 4

A 5.0% yellow pigment dispersion was prepared according to the following procedure.

A mixture of 2.5 grams of Microlith® Yellow 2R-WA chip (Ciba Geigy Corp., Hawthorne, N.Y.), 7.4 grams of Carboset® XL-30 (35% solid, acid number 0.57 meq, B. F. Goodrich Co., Cleveland, Ohio), 0.9 grams of ammonium hydroxide solution (29.6% ammonia), 5.0 grams of isopropyl alcohol, and 14.2 grams of deionized water was roll-milled, coated, and dried as in Example 1. The coating was imaged and developed as in Example 1 except heating at 135° C. was continued for 3 minutes. A high density, high resolution bright lemon yellow image with dots having sharp edges on a clear background was produced.

Example 5

The black coating prepared from Example 1 was imaged and developed as in Example 1 with the exception that 5% of phenyltrimethylammonium hydroxide in distilled water was used as the ink. A high density, high resolution black image with dots having sharp edges on a clear background was produced.

Example 6

The yellow coating prepared as in Example 3 was imaged and developed as in Example 1 with the exception that 5% of phenyltrimethylammonium hydroxide in distilled water was used as the ink. A high density, high resolution bright lemon yellow image with dots having sharp edges on a clear background was produced.

Example 7

The black coating was prepared, imaged and developed as in Example 1 with the exception that 0.193 mmol/gram of 1,3-(bistripropylammonium)xylene hydroxide, a difunctional esterification agent with potential to crosslink the polymer, in distilled water was used as the ink. A high density, high resolution black image with dots having sharp edges on a clear blackground was produced.

Example 8

The yellow coating prepared as in Example 2 was imaged and developed as in Example 1 with the exception that 0.193 mmol/gram of 1,3-(bistripropylammonium)xylene hydroxide, a difunctional esterification agent with potential to crosslink the polymer, in distilled water was used as the ink. A high density, high resolution bright yellow image with dots having sharp edges on a slightly yellow background due to pigment stain was produced.

Example 9

The yellow coating prepared as in Example 3 was imaged and developed as in Example 1 with the exception that 0.193 mmol/gram of 1,3-(bistripropylammonium)xylene hydroxide, a difunctional esterification agent with potential to crosslink the polymer, in distilled water was used as the ink. A high density, high resolution bright lemon yellow image with dots having sharp edges on a clear background was produced.

Example 10

A coating solution having the following composition was prepared: 25 grams of Carboset XL-19 (40% solids, acid number 0.57 meq, B. F. Goodrich Co., Cleveland, Ohio), 1.0 gram of ammonium hydroxide solution (29.6% ammonia), 10 grams of isopropyl alcohol, and 4 grams of deionized water. The solution was coated on a 3 mil thick resin-subbed polyethylene terephthalate base. After drying, the coating was heated at about 130° C. for a few seconds to produce a clear coating having a thickness of about 20 microns. The coating was then imaged and developed as in Example 1 with the exception that 0.385 mmol/gram of 1,3-(bistripropylammonium) xylene hydroxide, a difunctional esterification agent with potential to crosslink in distilled water was used as the ink. The finished negative relief image had fine details with sharp edges, and the thickness remained at about 20 microns.

What is claimed is:

1. A method for preparing negative-working, relief images comprising the sequential steps of:
   (a) providing a non-photosensitive layer, said non-photosensitive layer comprising an acid-containing polymer;
   (b) applying an ink imagewise to the non-photosensitive layer to produce imaged areas and unimaged areas, said ink comprising an esterification agent which is capable of reacting with the acid groups in the polymer to form water-insoluble ester groups;
   (c) drying the non-photosensitive layer to induce or accelerate the esterification reaction between the acid groups and the esterification agent in the imaged areas; and
   (d) washing the non-photosensitive layer with an aqueous developer solution to remove the unimaged areas of the non-photosensitive layer.

2. The method of claim 1 wherein the acid-containing polymer contains about 0.4 milliequivalents of acid function per gram of polymer.

3. The method of claim 1 wherein the drying in step (c) is conducted in the presence of heat to accelerate the esterification reaction.

4. The method of claim 1 wherein the polymer has about 0.4 to 11.0 meq acid functions per unit weight of the polymer.

5. The method of claim 1 wherein the non-photosensitive layer further comprises a colorant.

6. The method of claim 1 wherein the non-photosensitive layer further comprises at least one compound selected from the group consisting of plasticizers, polymeric modifiers, adhesion promoters, and coating aids.

7. The method of claim 1 wherein the non-photosensitive layer is present on a support.

8. The method of claim 1 wherein the ink comprises an aqueous ink containing an aqueous carrier medium.

9. The method of claim 1 wherein the esterification agent is represented by the general formula:

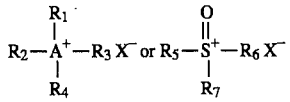

wherein A is N, P, or S;

$R_1, R_2, R_3, R_4, R_5, R_6$, or $R_7$ are each independently alkyl, substituted alkyl, aryl, or substituted aryl having 1 to 9 carbon atoms, with the proviso that $R_4$ is not present when A is S; and X is an anion selected from the group consisting of hydroxide, carbonate, bicarbonate, halides, organic sufate such as methyl sulfate, and organic sulfonate such p-toluenesulfonate.

10. The method of claim 9 wherein the esterification agent is selected from the group consisting of tetramethylammonium hydroxide, phenyltrimethylammonium hydroxide, trimethylsulfonium hydroxide, trimethylsulfoxonium hydroxide, and (methoxymethyl)trimethyl-ammonium hydroxide.

11. The method of claim 8 wherein the aqueous ink further comprises a colorant.

12. The method of claim 8 wherein the aqueous ink further comprises a surfactant.

13. The method of claim 8 wherein the aqueous carrier medium comprises water or a mixture of water and at least one water soluble organic solvent.

14. The method of claim 8 wherein the water soluble organic solvent has at least one hydroxyl group.

15. The method of claim 8 wherein the aqueous ink is applied with an ink jet printer.

16. The method of claim 8 wherein the ink is applied using a felt pen or a fountain pen.

17. The method of claim 1 wherein the aqueous solution is water.

18. An image made according to the process of claim 1, 2 or 3.

19. An aqueous, developable element containing a latent image, said element comprising:
   (a) a non-photosensitive layer comprising (i) a substantially non-crystalline polymer consisting of an acid containing polymer and (ii) a latent image in the form of a stable, water-insoluble polymer blend, said latent image having been formed by imagewise applying a layer of ink comprising an esterification agent to said non-photosensitive layer; and
   (b) optionally a substrate.

20. The element of claim 19 wherein the acid-containing polymer contains about 0.4 milliequivalents of acid function per gram of polymer.

21. The element of claim 19 wherein the esterification agent is represented by the general formula:

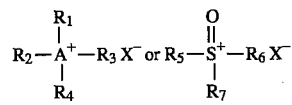

wherein A is N, P, or S;

$R_1, R_2, R_3, R_4, R_5, R_6$, or $R_7$ are each independently alkyl, substituted alkyl, aryl, or substituted aryl having 1 to 9 carbon atoms, with the proviso that $R_4$ is not present when A is S; and X is an anion selected from the group consisting of hydroxide, carbonate, bicarbonate, halides, organic sufate such as methyl sulfate, and organic sulfonate such p-toluenesulfonate.

22. The element of claim 21 wherein the non-photosensitive layer further comprises at least one compound selected from the group consisting of colorants, plasticizers, polymeric modifiers, adhesion promoters, and coating aids.

* * * * *